US006268093B1

(12) United States Patent
Kenan et al.

(10) Patent No.: US 6,268,093 B1
(45) Date of Patent: Jul. 31, 2001

(54) METHOD FOR RETICLE INSPECTION USING AERIAL IMAGING

(75) Inventors: Boaz Kenan; Yair Eran, both of Rehovot; Avner Karpol, Nes Ziona; Emanuel Elyasaf, Rehovot; Ehud Tirosh, Jerusalem, all of (IL)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/417,518

(22) Filed: Oct. 13, 1999

(51) Int. Cl.$^7$ .......................................... G03F 9/00
(52) U.S. Cl. ........................ 430/30; 382/144; 356/237
(58) Field of Search ............................. 430/30; 382/144; 356/237

(56) References Cited

U.S. PATENT DOCUMENTS

| 3,725,574 | 4/1973 | Gast | 178/6.7 R |
| 4,926,489 | 5/1990 | Danielson et al. | 382/8 |
| 5,210,635 | 5/1993 | Nagata et al. | 359/198 |
| 5,481,624 | 1/1996 | Kamon | 382/144 |
| 5,563,702 | 10/1996 | Emery et al. | 356/73 |
| 5,795,688 | 8/1998 | Burdorf et al. | 430/30 |
| 5,838,433 | 11/1998 | Hagiwara | 356/237 |

FOREIGN PATENT DOCUMENTS 0 628 806   12/1994   (EP) .

OTHER PUBLICATIONS

Martino, R., et al., "Application of the Aerial Image Meaurement System (AIMS$^{TM}$) to the Analysis of Binary Mask Imaging and Resolution Enhancement Techniques," *SPIE*, vol. 2197, Jan., 1994, pp. 573–584.

Ferguson, Richard A., et al., "Application of an Aerial Image Measurement System to Mask Fabrication and Analysis," *SPIE vol. 2807 13$^{th}$* Annual Symposium on Photomask Technology and Management Sep. 23–23, 1993, Santa Clara, California. pp. 131–144.

*Primary Examiner*—Christopher G. Young
(74) *Attorney, Agent, or Firm*—Sughrue, Mion, Zinn, Macpeak, & Seas; Joseph Bach (57) ABSTRACT

A reticle inspection system for inspecting reticles can be used as an incoming inspection tool, and as a periodic and pre-exposure inspection tool. Mask shops can use it as an inspection tool compatible to their customers, and as a printable error detection tool. The inventive system detects two kinds of defects: (1) line width errors in the printed image; (2) surface defects. The line width errors are detected on the die area. The detection is performed by acquiring the image of the reticle under the same optical conditions as the exposure conditions, (i.e. wavelength, numerical aperture, sigma, and illumination aperture type) and by comparing multiple dies to find errors in the line width. Surface defects are detected all over the reticle. The detection of surface defects is performed by acquiring transmission and dark-field reflection images of the reticle and using the combined information to detect particles, and other surface defects.

32 Claims, 4 Drawing Sheets

METHOD FOR RETICLE INSPECTION USING AERIAL IMAGING

BACKGROUND OF THE INVENTION

1. Field of the Invention

This invention relates to techniques for inspecting reticles that are used in fabricating microelectronic devices through a microphotolithographic process. Particularly, the present invention relates to a method and an apparatus for detecting variations in line width and other defects that would be printed on the wafer using such reticles by emulating the operation of a specific photolithography tool in which this reticle is to be used. The invention is embodied in a method and an apparatus that can readily be used for inspecting reticles in the industrial environment.

2. Description of the Background Art

Modern microelectronic devices are commonly produced using a photolithographic process. In this process, a semiconductor wafer is first coated with a layer of photoresist. This photoresist layer is then exposed to illuminating light using a photomask (for simplicity, the terms photomask, mask, and reticle will be used here interchangeably) and subsequently developed. After the development, non-exposed photoresist is removed, and the exposed photoresist produces the image of the mask on the wafer. Thereafter, the uppermost layer of the wafer is etched. Thereafter, the remaining photoresist is stripped. For multilayer wafers, the above procedure is then repeated to produce subsequent patterned layers.

Increasing the number of components in microelectronic circuits produced using the above photolithographic process requires the use of very high resolution images in photoresist exposure. The major limitations on the resolution of the image that can be projected on the photoresist are created by the illuminating light diffraction effects on the features of the mask and the limitations on the quality of the mask itself. The diffraction effects become important when the wavelength of the electromagnetic radiation used in the exposure of the photoresist becomes significant with respect to the size of the features of the mask being reproduced during the exposure. Increasing the resolution and decreasing the size of the reproducible features of the projected images may be achieved by decreasing the wavelength of the light that is being used in the photoresist exposure. For this reason, it is advantageous to use the electromagnetic radiation in the ultraviolet region of the spectrum, which corresponds to the shorter wavelength. Particularly, ultraviolet i-line (365 nm) and deep UV (248 nm) wavelengths have been used.

Another method for increasing the resolution of the image is the use of RET (Resolution Enhancement Techniques) which include: off axis illumination, OPC (Optical Proximity Correction) reticles, and PSM (Phase Shift Mask) reticles.

Looking more closely at the OPC method, the layout of the design of the mask is altered in such a way that the mask produces a higher resolution image on the photoresist. The optical proximity corrections introduced into the mask design compensate for the optical proximity effects caused by the limited resolution of the optical exposure system used in the photolithographic process. An optical stepper is one example of the optical exposure system. Other types of optical exposure systems include optical scanners and step-and-scan exposure systems. Most common optical proximity effects include corner rounding, line end shortening, and line width non-linearity. Processing of the mask including mask etching also contributes to the proximity effects. To correct for the proximity effects, such as corner rounding, reentrant and outside serifs are added to the mask design, and to correct for the line width variations, so called sub-resolution features are used.

It should be appreciated by those skilled in the art that to produce an operational microelectronic circuit, a mask must be as defect-free as possible, preferably completely defect-free. Therefore, mask inspection tools are needed to detect various defects in the masks that can potentially reduce the microelectronic circuit fabrication yields. Smaller feature sizes of the masks used in the microphotolithographic process, as well as the use of the phase shift and OPC masks, require more sophisticated tools for mask inspection. For instance, the inspection of the phase shift masks requires not only finding "conventional" defects, such as particles, but also detecting errors in the thickness of various regions of the mask. Numerous systems for mask inspection have been developed in response to the growing demands of the electronic industry.

Early mask inspection tools used actual photoresist exposure to study the quality of the mask. According to this method, the mask is placed on the optical exposure system and used to actually expose the photoresist. The image obtained in this way is then studied to determine if the mask performs to the specifications. Because this method is expensive, time-consuming, and often inaccurate, it is uneconomical and inefficient.

Certain kinds of mask defects (called "surface" defects, for example, a particle on the surface of a mask) can be detected by inspecting the mask using the image of the mask produced by the light transmitted through the mask and the light reflected by one face of the mask. The mask inspection tool that uses this method acquires both images and analyzes them. The results of the analysis of the two images yield the information on the condition of the mask. The image analysis may use die-to-die comparison, die-to-database comparison, or reflected image to transmitted image comparison. In the die-to-die comparison method, the acquired images of a die of the mask are compared to the images of another die from the same mask. In the die-to-database method, the acquired images are compared to images that are simulated using the design specifications.

Such an inspection system can detect defects that may or may not print on the photoresist during the actual photolithographic process. The major drawback of this method is that it studies the physical structure of the mask independently of the optical image actually produced by the mask on the wafer. For instance, variations in the line width of the image that the mask produces frequently are higher than the corresponding variation in the line width of the mask itself. This phenomenon is called MEEF (Mask Error Enhancement Factor). Another example is PSM, in which there is no visible relation between phase error and the printed image. It is desirable, therefore, to relate the physical structure of the mask to the actual image that the mask creates on the photoresist, and to study directly the image that the mask actually produces.

In order to facilitate the evaluation of the mask performance during the mask development stage, IBM has recently developed a microscope called the Aerial Image Measurement System (AIMS™) that uses an aerial imaging method for mask evaluation. The Zeiss MSM100, a mask development tool, implementing AIMS™ technology, is available commercially from Carl Zeiss, GmbH of Germany. The MSM100 system can be used to evaluate the printability properties of newly developed masks.

An aerial imaging method is described in European Patent Application No. 0628806. According to this method, the inspection system simulates an optical exposure system that is used to expose the photoresist during semiconductor device fabrication. The optical system of the mask inspection device uses a set of the exposure conditions, that are used in the actual microphotolithographic process to create an image that would be produced on the photoresist during actual device fabrication. In particular, the system matches the wavelength, the partial coherence of the exposure light, illumination aperture and the imaging numerical aperture NA of the optical exposure system. The created aerial image is magnified and detected using a CCD camera that is sensitive to ultraviolet radiation.

In addition to evaluation of the mask design, the use of the aerial imaging method permits the detection of the mask defects that would print during the actual microphotolithographic process. Almost any kind of defect on the reticle, including a particle on the transparent region, a pin-hole, a pin-dot, an edge truncation, etc. causes line width variation in the printed image. The term "line width" used herein describes a set of parameters of the image produced by the reticle on the photoresist, such as wire-to-wire distances, that determine whether the reticle is to be rejected as defective. The acquired aerial images are analyzed using the AIMS™ software also developed by IBM. Despite all the above advantages, the Zeiss/IBM system has limited application as a printability review station for a set of detected defects by other inspection systems.

U.S. Pat. No. 5,481,624 describes a system that uses aerial imaging for die-to-database inspection of phase shift masks. According to the described inspection method, an aerial image produced by a phase-shift mask is verified against the original circuit pattern that was used in manufacturing of the mask.

U.S. Pat. No. 5,795,688 discloses a system that uses an aerial imaging method for inspection of microphotolithographic masks having optical proximity corrections using a die-to-database comparison. In this system, an aerial image of a mask manufactured using the aforementioned optical proximity corrections is compared to an aerial image of the same mask obtained by simulation. Various defects in the mask, such as missing chrome, contamination, glass damage, phase defects, and transmission errors are identified as discrepancies between the two images. The simulation process takes into account optical proximity effects due to the limited resolution of the optical exposure system and the proximity effects due to the photoresist etching during the mask manufacturing process. The simulated aerial image can be obtained using the original mask design or, alternatively, using the mask design corrected for optical proximity effects.

Despite the above advances in the mask inspection technology, at the present time there is no inspection tool that would fulfill the demands of the industry. The IBM system is designed for mask development labs, and not for production stage mask inspection, and therefore does not possess adequate automation.

Also, the inspection methods based on die-to-database comparison that are used by the existing aerial imaging systems are not always effective, especially for highly complicated mask designs. The die-to-database comparison method uses models describing the behavior of an optical exposure system, as well as the effects of the etching used in the mask manufacturing process to produce the simulated image used in the mask inspection. However, the actual mask is different from the mask design due to limitations of the mask writing tool. As a result, there are limitations in the accuracy of the transformation from DB to aerial image. Inadequate simulation can lead to a significant numbers of "nuisance" defects—the discrepancies between the acquired aerial image and the simulated image caused not by the presence of actual defects in the mask, but by inadequacies in the simulation model. Nuisance defects can greatly complicate the mask inspection. For all the foregoing reasons, the limitations on the quality of the simulated images limit the performance of the aerial imaging inspection techniques that use the die-to-database comparison.

Accordingly, there is a need for a mask inspection system that would make it possible to detect errors in the line width of the image that the mask would actually produce on the photoresist.

The system also must be capable of detecting the presence of surface defects such as particles, contaminations, coating defects, and the like.

It also is desirable for the mask inspection system to provide speedy and reliable identification of the above mask defects. Such a system would be able to work efficiently in a clean manufacturing environment such as fabs and mask shops and increase the productivity thereof.

SUMMARY OF THE INVENTION

In view of the foregoing, it is one feature of the present invention to provide an inspection system that provides more complete information on the properties of the photolithographic mask. Particularly, it is a feature of the present invention to provide a mask inspection system capable of detecting errors in the image that the mask would actually print on the photoresist during exposure.

It is another feature of the present invention to provide a mask inspection system capable of detecting the presence of other mask defects, particularly surface defects.

It is yet another feature of the present invention to provide a mask inspection system that provides speedy and reliable identification of the above mask defects.

To implement the above features and achieve the advantages of the present invention, there is provided a method for inspecting a multiple die reticle that is used with an optical exposure system under a set of exposure conditions, the multiple die reticle including at least a first and a second die. In accordance with the inventive method, a plurality of images of the reticle are acquired using transmitted light under the indicated exposure conditions. The plurality of images of the reticle includes images of the first die and images of the second die. Each of the plurality of images of the reticle corresponds to a different focal condition. The images of the first die and the second die are used to detect variations in line width in the first die.

Also in accordance with the invention, an apparatus is provided which can be used to practice the inventive method. In one embodiment, the apparatus includes a scanner for acquiring a plurality of images of the multiple die reticle under the set of exposure conditions. The plurality of images includes images of the first die and images of the second die. The apparatus also includes an image processing module for detecting variations in line width of the first die by comparing the images of the first die and the images of the second die.

Also in accordance with the invention, an apparatus is provided including: a laser light source; a homogenizer and a transmission light illumination means for illuminating the reticle; and an optical system for producing a plurality of magnified images of the reticle under the set of exposure conditions, the optical system having variable illuminating and imaging apertures for reproducing the indicated set of exposure conditions. The plurality of acquired images of the reticle includes images of the first die and images of the second die. The inventive apparatus also includes an image acquisition module for acquiring the plurality of magnified images of the reticle; and an image processing module for analyzing a condition of the reticle by comparing the images of the first die and the images of the second die. The apparatus also includes an optical system for acquiring dark field reflection images.

BRIEF DESCRIPTION OF THE DRAWINGS

The above features and advantages of the present invention will become more apparent from the following detailed description of preferred embodiments thereof with reference to the attached drawings in which.

DETAILED DESCRIPTION OF PREFERRED EMBODIMENTS

Embodiments of the invention will now be described, by way of example only, with reference to the attached drawings.

The system for defect detection according to the present invention is composed of three main modules: (1) a scanner module; (2) a defect detection image processing hardware module; and (3) a post process and review station. The scanner module scans the reticle and acquires aerial images of the reticle in transmitted light at a plurality of focal planes, preferably three, and dark field images of the reticle in reflected light at one focal plane. By properly adjusting the apertures of the illuminating and imaging parts of the optical system, the NA and the coherence factor are adjusted. The optical system of the scanner module simulates the behavior of an optical exposure system and, as a result, the acquired transmission light aerial images are optically equivalent to those produced on the photoresist under a given set of exposure conditions. The image processing module then uses the acquired images to detect the defects in the reticle.

Figure 4:
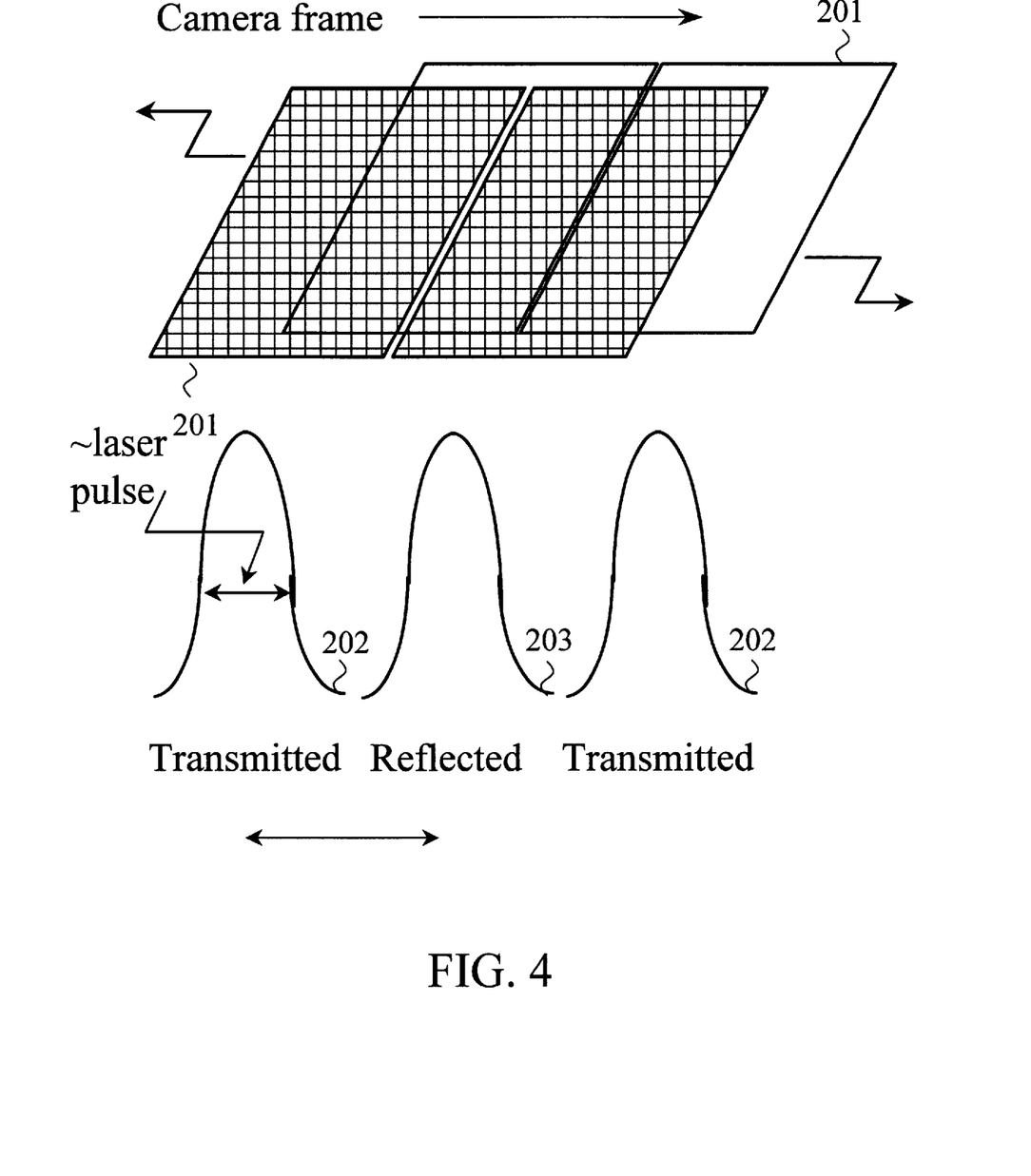
FIG. 4 illustrates a method for acquiring transmission and reflection images in an interlace mode.

The system detects reticle defects, such as line width errors, by using die-to-die comparison of the aerial images of multiple dies. In addition, "surface" defects in the reticle are detected by comparing the transmission images of the reticle to the dark field reflection images of the reticle. The reflection to transmission image comparison procedure operates on the entire scanned area of the reticle regardless of the dies. The scanning of the reflection images is separated in time from scanning of the transmission images. Such separation can be accomplished by using a separate scan for each particular type of image. For instance, during the first scan the system acquires the reflection image, and during the second scan the system acquires the transmission image. The time separation may also be achieved by acquiring both types of images in an interlace mode, as shown in FIG. 4. In FIG. 4, a table holding the reticle is moved in such a way, that the camera. frame 201 moves continuously relative to the surface of the reticle. Light pulses 202 and 203 are generated alternatingly using the transmission and the reflection light illumination systems, respectively. Therefore, the camera acquires images of the reticle alternatingly in transmitted and reflected light. The camera window is arranged is such a way, that the camera simultaneously acquires images of two rectangular spots of the reticle, which provides for continuity of image acquisition. The imaging resolution need not be the same for the two detection modes. A software-based post process and review station reviews and analyzes the images of the detected defects through the focus range of the exposure system.

There now follows a detailed description of the three modules of the inventive reticle inspection apparatus and their methods of operation.

Scanner unit

Preferably, the scanner unit scans the entire active area of the reticle and acquires sequentially three or four digital images: two or three transmission aerial images at different focal planes, and a dark field reflection image. The scanner unit supplies the scanned images of the detected defects acquired during scanning for off-line review. The scanner unit is also capable of acquiring additional aerial images of the detected defects at additional focal planes during the review stage.

Figure 1:
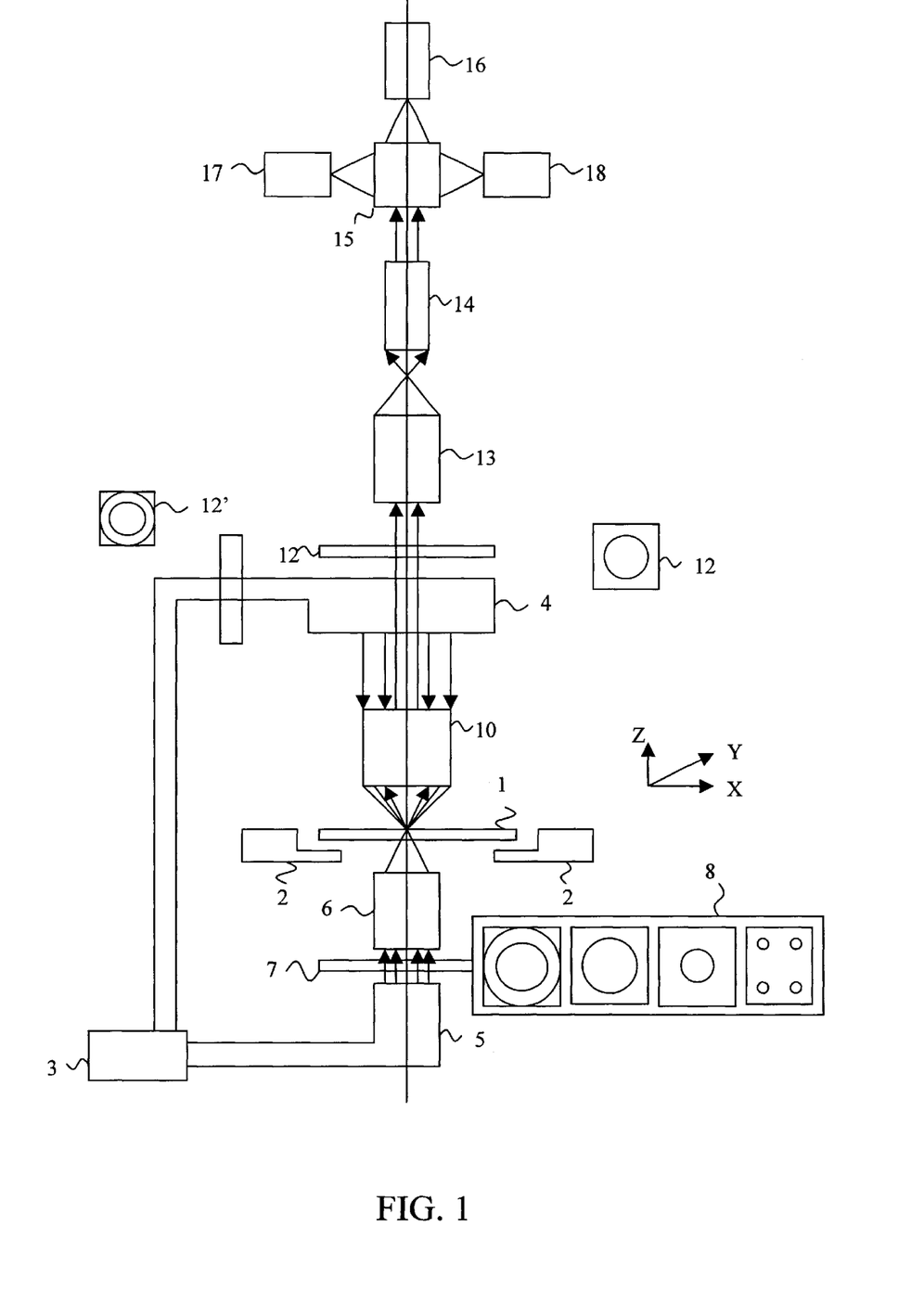
FIG. 1 shows a schematic diagram of the scanner unit of the reticle inspection system according to an embodiment of the present invention.

FIG. 1 illustrates the internal organization of the scanner unit. The scanner unit includes many of the components of an optical microscope column. With reference to FIG. 1, the scanner scans a reticle 1 fixed on a moving stage 2. Laser light from a light source 3 is used to illuminate the reticle 1. The light source 3 preferably is a pulsed laser source, but the light source 3 could also operate continuously. The radiation provided by the light source 3 preferably has the exact wavelength of the exposure system, with which the reticle is designed to be exposed, for example deep UV (248 nm) or 193 nm.

When the scanner module acquires the aerial images of the reticle in the transmitted light, the bottom surface of the reticle is illuminated using a transmission light illumination system which includes a homogenizer and illumination optics 5, an illumination aperture 7, and a condenser 6. The homogenizer has a function, among others, of reducing speckle resulting from the use of a coherent illumination source. The structure of the homogenizer is not critical, so long as the homogenizer reduces speckle appropriately. The aerial images of the reticle 1 acquired by the scanner module simulate the images that would be produced by the reticle 1 on the photoresist, when the reticle 1 is placed on an optical exposure system. In this mode, the radiation from the illuminating light source 3 passes through the homogenizer and illumination optics 5 and the condenser 6. The condenser 6 reduces the diameter of the illuminating beam of light in the reticle plane to just a little more than the size of the field of view of the imaging system. Between the condenser 6 and the homogenizer and illumination optics 5 there is an illumination numerical aperture 7 ($NA_{ill}$), the size and the shape of which can be changed by an illumination aperture changer 8. Adjusting the size and the shape of the illumination aperture 7 permits reproduction of the illumination and the coherence conditions of the photoresist exposure tool. In particular, the aperture 7 is selected to set the proper coherence ratio sigma and to choose between on axis and off axis illumination such as a quadrupole or an annular mode of illumination, as described below.

The objective 10 collects the light transmitted by the reticle 1 in the transmission light illumination operating mode and the light reflected by the reticle in the dark field illumination operating mode. After passing through the objective 10, the light passes through the collecting adjustable numerical aperture diaphragm 12, which is situated in the optically designed aperture stop surface or a conjugate surface. The size of the collecting numerical aperture diaphragm 12 is selected to reproduce the operating conditions of the exposure system used in the microphotolithographic process. Therefore, the aerial image of the reticle 1 created by the optical system of the reticle inspection apparatus according to the invention is equivalent to the image produced on the photoresist by the optical exposure system during the microphotolithographic process.

Figure 2:
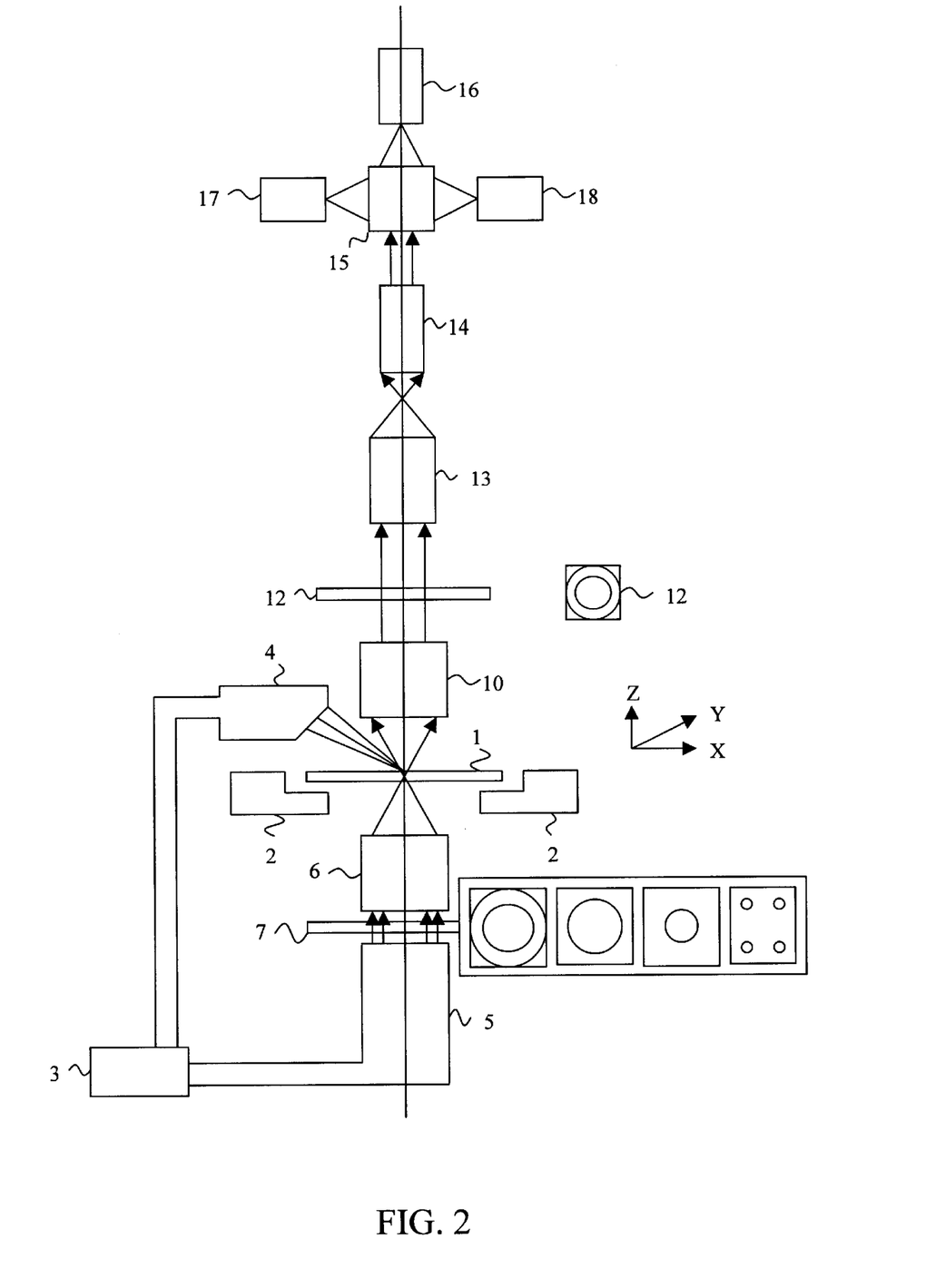
FIG. 2 shows a schematic diagram of the scanner unit of the reticle inspection system according to another embodiment of the present invention.

The light emerging from the numerical aperture 12 is then focused by a lens, such as tube lens 13 to produce an image of the reticle 1. This image is then magnified by a zoom magnification lens 14. After passing through the zoom magnification lens 14, the light beam is being split by a beam splitter 15 to produce three images of the reticle in the three CCD cameras of the reticle inspection apparatus: a first focus/dark field reflection camera 16, a second focus camera 17, and a third focus camera 18. It should be noted that while the use of three CCD cameras presently is preferred, the invention is not limited to the use of this number of CCD cameras. Any camera configuration or combination that produces the desired three images of the reticle may be used When the scanner acquires images of the reticle in the reflected light, the reticle is being illuminated by a dark field illumination system 4. In this mode, the dark field illumination system 4 directs a beam of illuminating light from the laser source 3 at the top face of the reticle 1. The light from laser source 3 directed at the top face of the reticle 1 by the dark field illumination system passes through a annular numerical aperture ($NA_{ann}$) diaphragm 12'. In one embodiment of the invention the aperture 12' is ring-shaped so that the light, after passing through the aperture 12', goes around objective 10 and illuminates reticle 1. In another embodiment, the illuminating light emerging from the dark field illumination system 4 passes through the objective 10 and again illuminates reticle 1. A portion of this illuminating light is reflected by the reticle 1 and travels in the opposite direction, passing through the objective 10 and then through the collecting numerical aperture ($NA_{coll}$) diaphragm 12, before being detected as described above. In another embodiment of the invention, as shown in FIG. 2, the dark field illumination system 4 is placed to the side of the objective 10 so as to illuminate the top face of the reticle 1 from the side. In this configuration, the illuminating light from the dark field illumination system 4 need not pass through the NA diaphragm 12 and objective 10.

In another embodiment of the invention the system is equipped with a suitable auto-focusing system (not specifically shown) aimed at maintaining the inspection plane of the reticle in the focal plane of the objective 10. This is generally done by providing motion of the stage 2 or the objective 10 in the Z direction.

When the reticle inspection apparatus according to the invention operates in the dark field illumination mode, the top face of the reticle 1 is illuminated by the dark field illumination system 4 and the first focus/dark field reflection camera 16 acquires the image of the reticle 1 in the reflected light.

On the other hand, when the reticle inspection apparatus operates in the transmission light illumination mode, the reticle 1 is illuminated by the transmission light illumination system 5 and the three images of the reticle in the transmitted light are simultaneously acquired by the first focus/dark field reflection camera 16, the second focus camera 17, and the third focus camera 18. During this operating mode, the first focus camera 16 is in focus, while the second and the third focus cameras 17 and 18 are at the edges of the simulated process window of the exposure system. The term "process window" refers to the acceptable range of the focus and the exposure dose that can be used in the exposure of the reticle by the exposure system to achieve the image on the photoresist, which satisfies the requirements of the wafer specification. The second focus camera 17 is at one edge of the process window, while the third focus camera 18 is at the other edge. It should be noted that the aerial images of the reticle created in the cameras 16–18 are significantly magnified (typically x50–x200). On the other hand, in the exposure system, the image of the reticle is demagnified (typically x1/4–x1/5). For this reason, the process window for creating the aerial image (the distance between marginal allowed focal planes) is so magnified, as to allow a large variation in the positions of the focal planes of the cameras. The positions of these focal planes can be adjusted by conventional mechanical means.

It will be readily appreciated that the images of the reticle acquired by cameras 16–18 can be used to determine the process window of the reticle exposure system. This can be done through comparison of the aerial images of the reticle, acquired under different exposure and focal conditions, with the corresponding design specifications of the wafer. The focal position of the system can be further finely adjusted by displacing the reticle in z-direction, as shown in FIG. 1.

The method of operation of the inventive reticle inspection apparatus is described below. The stage 2 moves the reticle 1, in such a way that the scanner unit scans the reticle, slice-by-slice in a serpentine manner. The width of a slice is preferably the width of the optical field of view of the system. The CCD cameras 16, 17, and 18 can be line CCD devices capable of simultaneously acquiring an image of the entire slice of the reticle 1. Alternatively, CCD cameras 16, 17, and 18 can be of a shift-delay type. Preferably, the cameras 16–18 are sensitive in the ultraviolet range, particularly in the deep UV range.

In one embodiment of the invention, the moving stage 2 and the reticle 1 move in a continuous manner. The CCD cameras 16, 17, and 18 are triggered by the stage 2 to acquire the image of the slice of the reticle 1 every time the stage has passed one field of view. Preferably, the image of the reticle is acquired by shooting a laser pulse from laser source 3 through the illumination optics 4 or 5 of the system and acquiring the images with digital area cameras 16–18 through the imaging optics. It will be appreciated that if the pulsed laser source is used to illuminate the reticle, the reticle need not be stationary at the time of the image capture and, for this reason, the reticle can be moved continuously. The same result can be achieved through using a short exposure time for the cameras 16–18. In another embodiment of the invention, the stage 2 and the reticle 1 move in a stepwise manner.

As can be appreciated, when the apertures 7 and 12 are inserted into the beam's path during the transmission light illumination mode, the optics of the scanner unit emulates the optics of an exposure tool. Particularly, the illumination aperture 7 selectively alters the effective illuminating $NA_{ill}$ of the condenser 6, while the aperture 12 changes the collection numerical aperture $NA_{coll}$ of the objective 10. A ratio of the $NA_{ill}$ to the $NA_{coll}$ is called a pupil filling ratio of the objective and is responsible for the coherence of the reticle illumination. The smaller the value of the pupil filling ratio, the higher the coherence of the reticle illumination.. Note that the numerical aperture 7 can have more complex configuration, for example four small apertures displaced with respect to the axis of the beam. Other illumination aperture configurations can be used to emulate different exposure systems and their interaction with the reticle.

In addition to determining the coherence of the illuminating light, the illumination numerical aperture 7 can be used to shape the light beam to more closely resemble the exposure tool. To that end, the illumination aperture 7 may be a diffractive optical element or a proper apodization aperture affecting also the shape of the incident beam. The aperture 7 can provide a flat-top beam, i.e. a beam with uniform intensity distribution over the cross-section of the beam. Accordingly, by adjusting the shape and the size of the numerical apertures 7 and 12, the inspection tool emulates the illuminating conditions of the exposure tool, including its effective NA, the coherence of the illumination, and the shape of the illuminating beam. For every field of view, three or four images are acquired: two or three transmission aerial images at different focal planes and a high resolution dark field reflection image. By properly adjusting the size of the numerical apertures 7 and 12, the system simulates the behavior of an optical exposure system and, as the result, the acquired aerial images are optically equivalent to those produced on the photoresist under a given set of exposure conditions.

In the transmission light illumination mode, the different focus images of the reticle 1 are acquired with three CCD cameras 16–18 at different focal conditions. Camera 16 is also used to acquire the image of the reticle in the reflected light in the reflected light illumination mode. In another embodiment, a separate camera is used to acquire the dark field reflection image in the dark field illumination mode. The acquisition of the transmission and the dark field reflection images is sequential. In one embodiment of the invention it is accomplished by interlacing the fields of views. This can be done if the same pixel size is used in both imaging modes. In another embodiment, two separate scans are used. Preferably, the digital data from each camera is compensated for distortion, registration error, illumination non-uniformity, and the camera's pixel non-uniformity. The corrected data is sent with the synchronization signal to the image processing module. The scanner is controlled by a main controller computer (not shown).

Preferably, the scanner unit also includes a hardware synchronization module (not shown) which synchronizes the system, and creates dummy signals for diagnostics purposes. The movement of the stage 2 is monitored by a laser interferometer (not shown) that generates a clock for the system. The synchronization module uses this clock to synchronize the laser pulses from the illuminating laser source 3 and the exposures of the cameras 16–18. The compensation cards (not shown) compensate for optical image distortions, registration errors, variations of the camera pixels' sensitivity, and variations of the laser pulses' intensity. The conditions of the scan are set by the operator through the main control computer (not shown) to match the exposure conditions (NA, sigma, aperture type) and the detection sensitivity (magnification).

The scanner transmits digital images, synchronization and clock signals to the image processing module. The image data transmission lines can be made sufficiently long to permit the scanner unit and the image processing module to be in different locations. Preferably, the scanner can be used by the post process and review station through the main computer to grab images of the defects at various focus positions.

Image Processing Module

Preferably, the image-processing module is a real-time image-processor that finds defects in the imaged pattern generated using the scanner unit. There are two kinds of defects that need to be detected: (1) surface defects, such as particles, damaged antireflection coating, photoresist residuals, etc.; and (2) errors in the printed pattern. In some cases, surface defects can cause errors in the printed image. Preferably, the image processing module can process in parallel three to four digital images of the reticle, received from the scanner: two to three aerial images from different focal points, and a dark field reflection image. Errors in line width are detected by comparing die to die images from the same focal plane. Surface defects are detected by comparing the dark field reflection image of the reticle to the transmission image of the same reticle. Because the die-to-die and the transmission-to-reflection comparison do not occur at the same time, they may be carried out by the same image processing module. The image processing module grabs and saves images of the detected defects and the corresponding good dies for review in the post process and review station.

Preferably, the three streams of the image data from the three focal cameras 16, 17, and 18, are transferred to three different image processing modules for processing. Camera 16 is also used as the dark field camera in the dark field imaging mode. The dark field image is transferred to an additional image processing module.

There are two modes of processing—D2D (die-to-die) and T&R (transmitted & reflected). In both operating modes, D2D and T&R, the image processing module spools the data from the entire slice before starting processing. Since the D2D and the T&R image processing operations do not occur at the same time, they can be run on the same image processing hardware, but it should be noted that each mode may require different image processing components such as image detectors.

The D2D comparison procedure operates in the following way. Initially, the image processing unit spools the entire slice of the reticle 1 into its buffers. After the image data of the full slice of the reticle 1 is spooled, each image processing channel of this image processing unit retrieves two streams of image data, each stream corresponding to a separate die, registers one stream to the other and then compares the image data contained in the two streams. One of the two streams of image data is delayed by L lines (L being the die's repeat frequency), so that the two image streams correspond to two different dies. During this processing stage, the processing is limited only to the die area of the reticle. In another embodiment, any one die can be compared to the average of all the other dies in the buffer.

In the T&R operating mode, the image processing functions in the following way. After the image data representing a full slice of the reticle is spooled in the buffers, each image processing channel retrieves two streams of image data, registers one to the other and then runs the detection algorithm on their combined image. In this operating mode, the processing is not limited to the die area, and can be done on the entire mask.

Post process and review station

The post process and review station is used to automatically analyze the image data. It also enables the user to review the suspected defects detected with the image processing module. Preferably, the post process and review station is software-based and operates on a computer workstation. Particularly, the defects in the reticle detected using die-to-die comparison of aerial images, or using the comparison of the aerial images to the acquired dark field reflection image, can be further studied and classified by comparing the acquired aerial images to the simulated aerial images, which can be obtained using simulation software. For example, one of the widely available simulation software packages (AIMS™, VSS™, Sigma C, Finley™) can be adapted for this purpose. The AIMS™ software was designed by IBM Corporation to be used on the MSM100 tool and can simulate the aerial images of the phase shift masks, as well as the masks having optical proximity corrections. The VSS™ and Finley™ software packages can run on a general purpose computer. These packages input the exposure conditions, such as the exposure system's NA, and produce the simulated image by emulating the behavior of the reticles as well as that of the photoresist. This simulated image is used to conduct additional, more accurate study and classification of the detected defects.

Preferably, the post process and review station is operated using a userfriendly graphical user interface. The post process and review station has several modes of operation.

The post process and review station reviews and classifies the detected defects at the user control. According to an embodiment of the invention, the user can select a defect from the defect list created by the image processing module. In response, the system displays the detected defects and the corresponding good die aerial images at the focal points of the scan on the monitor screen. In this embodiment, the line width measurements of the defective and good features (at the wafer plane) can be calculated according to the user's request. The system is also capable of performing a calculation on the probability of the defect printability.

According to an embodiment of the invention, the processor of the post process and review station tries to build an overlapping process window for all the defective and the corresponding good dies. The window's graph is presented to the user. Defects that cannot be included in a reasonable process window are excluded from the common process window during the automatic calculation. The calculation of the process window makes it possible to offset the exposure system's working point accordingly.

In another embodiment, more accurate analysis of the process window is accomplished using on-line review of the defects. According to this embodiment, images at a larger number of focal points are grabbed at the user's request and processed immediately by a more accurate overlapping process window. In this embodiment, high NA, high-resolution images of the defects, especially the out of window defects, are acquired. This enables one to visualize the actual defects on the reticle, especially those defects that cause the line width variations on the wafer. If the defect is a particle on the chrome of the reticle, a reflection image thereof is also acquired and used in the defect analysis.

In another embodiment of the invention, the system uses the results of the line width measurements for individual dies of the reticle 1 to generate a map of the line width variations for the entire reticle. The generated map is then displayed to the user in a graphical format. For instance, different areas of the reticle having different values of the line width variations may be drawn in different colors. Such a map provides a very useful method for visualizing how the amount of variation in line width changes from die-to-die on the reticle. For example, it is important to see how the amount of variation in line width is different for the peripheral dies, as compared to the central dies.

Figure 3:
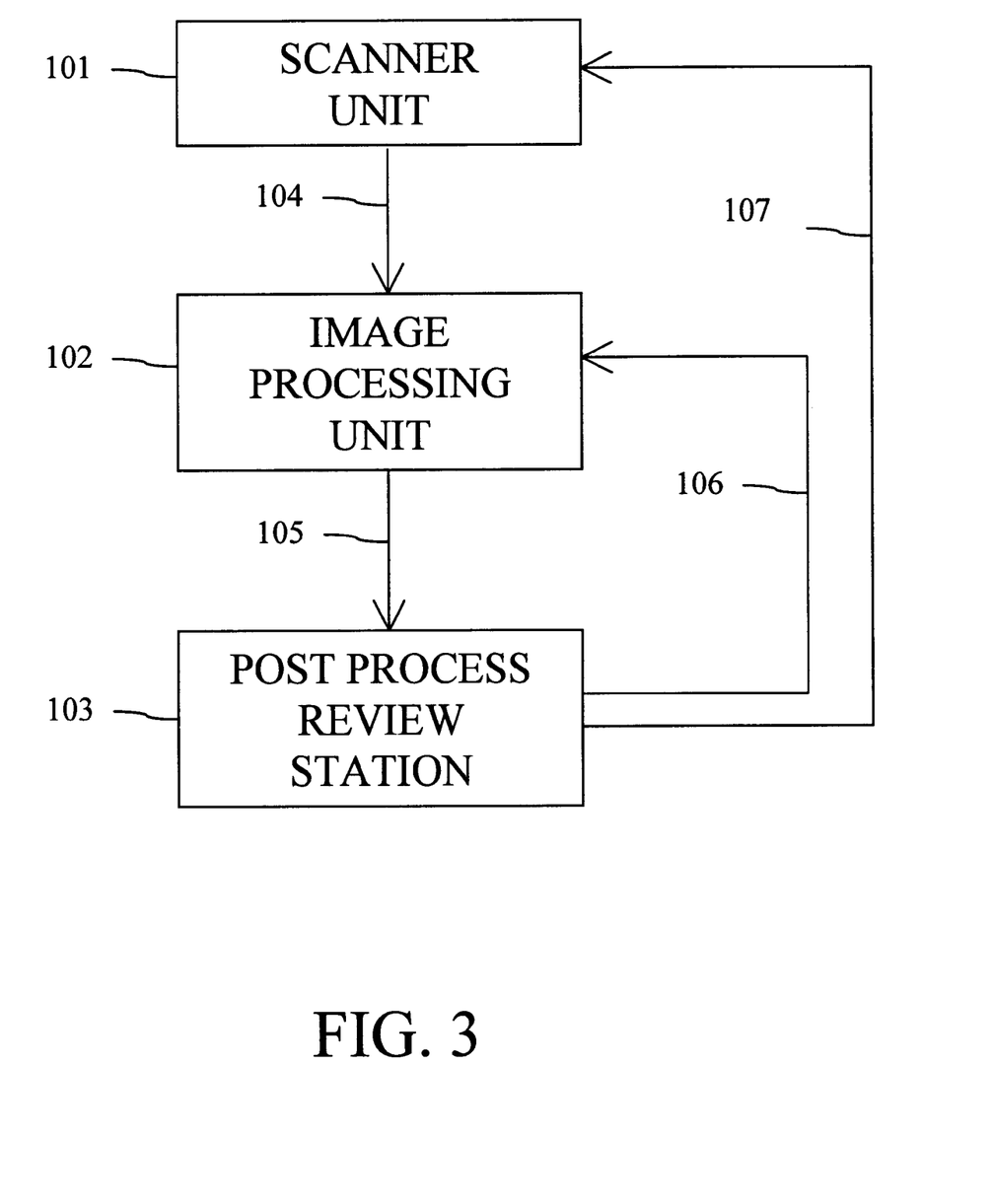
FIG. 3 shows a block diagram of the reticle inspection system according to an embodiment of the present invention.

FIG. 3 shows a block diagram illustrating the operation of the reticle inspection system according to an embodiment of the invention. With reference to FIG. 3, the scanner unit 101 acquires images of the reticle and transmits the image data 104 to the image processing unit 102 for processing. The image processing unit 102 performs processing of the image data and detects defects in the reticle. After that, the image processing unit 102 transmits the processed image data 105 of the defective and good dies to the post process and review station 103 for subsequent analysis and display. The post process and review station can send control signals 106 and 107 to the image processing unit and the scanner unit. If in the process of image analysis in the post process and review station additional images are needed, such as images from additional focus surfaces, the post process and review sends request 107 to the scanner unit 101 to grab additional images and request 106 to the image processing unit to process those additional images.

While the invention has been described herein using preferred embodiments thereof, it will be readily appreciated by those skilled in the art that various modifications in form and detail may be made therein without departing from the scope and spirit of the invention.

What is claimed is:

1. A method for inspecting a multiple die reticle that is used with an optical exposure system under a set of exposure conditions, said multiple die reticle including at least a first die and a second die, said method comprising:
   acquiring a plurality of aerial images of said reticle using a transmitted light, said plurality of aerial images being acquired within a process window of said exposure system and using said set of exposure conditions; said plurality of aerial images including a first plurality of aerial images of said first die and a second plurality of aerial images of said second die; and
   comparing said first plurality of aerial images of said first die and said second plurality of aerial images of said second die to detect variations in line width in said first die.

2. The method of claim 1, wherein prior to said comparison step, said aerial images of said first and said second dies are transformed to simulate a behavior of a exposure system and the photoresist.

3. The method of claim 1, wherein said acquired aerial images of said reticle are magnified in relation to corresponding images created on photoresist by said optical exposure system using said reticle.

4. The method of claim 1, wherein each of said first plurality of aerial images of said first die corresponds to a different focal condition; and each of said second plurality of aerial images of said second die corresponds to a different focal condition.

5. The method of claim 4, wherein different focal conditions represented in said first and second pluralities of aerial images expands the focus dimension of the process window of the exposure system.

6. The method of claim 1, wherein there are three aerial images in said first plurality of aerial images, and three aerial images in said second plurality of aerial images.

7. The method of claim 1, wherein:
   a first aerial image of said first plurality of aerial images of said first die is in focus;
   a second aerial image of said first plurality of aerial images of said first die is out of focus in a positive direction; and a third aerial image of said first plurality of aerial images of said first die is out of focus in a negative direction.

8. The method of claim 7, wherein:

a first aerial image of said second plurality of aerial images of said second die is in focus;

a second aerial image of said second plurality of aerial images of said second die is out of focus in a positive direction; and a third aerial image of said second plurality of aerial images of said second die is out of focus in a negative direction.

9. The method of claim 1, further comprising:

acquiring an image of said reticle using a reflected light; and using said acquired image of said reticle and said plurality of aerial images of said reticle to detect defects in said reticle.

10. The method of claim 9, wherein said reflected light is produced by illuminating said reticle using a dark field illumination system.

11. The method of claim 1, further comprising displaying results of said comparison in a graphic form.

12. The method of claim 1, further comprising using results of said comparison to produce a map of said variations in said line width of said first die.

13. The method of claim 1, wherein said transmitted light is provided using a pulsating light source.

14. The method of claim 13, wherein said pulsating light source is a pulsating laser.

15. The method of claim 9, wherein said reflected light is provided using a pulsating light source.

16. The method of claim 15, wherein said pulsating light source is a pulsating laser.

17. The method of claim 1, wherein said acquiring said plurality of aerial images comprises placing said reticle on a stage and moving said stage in a continuous manner.

18. The method of claim 13, wherein said acquiring said plurality of aerial images comprises placing said reticle on a stage and moving said stage in a continuous manner.

19. The method of claim 15, wherein said acquiring said plurality of aerial images comprises placing said reticle on a stage and moving said stage in a continuous manner.

20. A method for inspecting a reticle that is used with an optical exposure system under a set of exposure conditions, said method comprising:

acquiring a plurality of aerial images of said reticle using a transmitted light, said plurality of aerial images being acquired within a process window of said exposure system and using said set of exposure conditions;

acquiring an image of said reticle using a reflected light; and using said acquired image of said reticle and said plurality of aerial images of said reticle to detect defects in said reticle.

21. The method of claim 20, wherein said acquired images of said reticle are magnified in relation to corresponding images created on photoresist by said optical exposure system using said reticle.

22. The method of claim 20, wherein each of said plurality of aerial images of said reticle corresponds to a different focal condition.

23. The method of claim 20, wherein said transmitted and said reflected light are provided using a pulsating light source.

24. The method of claim 23, wherein said pulsating light source is a pulsating laser.

25. The method of claim 20, wherein said acquiring said plurality of aerial images comprises placing said reticle on a stage and moving said stage in a continuous manner.

26. The method of claim 23, wherein said acquiring said plurality of aerial images comprises placing said reticle on a stage and moving said stage in a continuous manner.

27. A method for determining a process window for exposure of a multiple die reticle by an optical exposure system, said reticle to be exposed by said optical exposure system under a set of exposure conditions, said method comprising steps of:

acquiring a plurality of aerial images of said reticle using a transmitted light under said set of exposure conditions; and using said acquired aerial images to determine said process window of said optical exposure system.

28. The method of claim 27, wherein:

a first image of said plurality of aerial images of said reticle is in focus;

a second image of said plurality of aerial images of said reticle is out of focus in a positive direction; and a third image of said plurality of aerial images of said reticle is out of focus in a negative direction.

29. The method of claim 27, wherein said plurality of aerial images of said reticle and said image of said reticle are acquired using a pulsating light source.

30. The method of claim 29, wherein said pulsating light source is a pulsating laser.

31. The method of claim 27, wherein said acquiring said plurality of aerial images comprises placing said reticle on a stage and moving said stage in a continuous manner.

32. The method of claim 29, wherein said acquiring said plurality of aerial images comprises placing said reticle on a stage and moving said stage in a continuous manner.

* * * * *